United States Patent [19]

Ballard et al.

[11] 4,139,933

[45] Feb. 20, 1979

[54] METHOD FOR FABRICATING A SCANNING ELECTRON MICROSCOPE MICROMETER SCALE

[75] Inventors: David B. Ballard, Derwood; Fielding Ogburn, Rockville; John P. Young, Laytonsville, all of Md.

[73] Assignee: The United States of America as represented by the Secretary of Commerce, Washington, D.C.

[21] Appl. No.: 848,176

[22] Filed: Nov. 3, 1977

Related U.S. Application Data

[62] Division of Ser. No. 736,978, Oct. 29, 1976, Pat. No. 4,068,381.

[51] Int. Cl.$^2$ .................... H01J 9/00; H01J 37/26; B23P 17/00
[52] U.S. Cl. ..................... 29/412; 29/592 R; 33/1 R; 204/37 R; 204/40
[58] Field of Search ............ 29/412, 592; 204/37 R, 204/40; 33/1 R, 107 R, 111; 250/310, 311

[56] References Cited

U.S. PATENT DOCUMENTS

| | | | |
|---|---|---|---|
| 2,116,927 | 5/1938 | Germer | 204/37 R |
| 2,859,158 | 11/1958 | Schaer | 204/37 R |
| 3,659,098 | 4/1972 | Politycki et al. | 250/505 |
| 3,954,420 | 5/1976 | Hyner et al. | 204/37 R |
| 3,987,529 | 10/1976 | Nakagawa et al. | 29/412 |
| 4,005,527 | 2/1977 | Wilson et al. | 33/111 |

OTHER PUBLICATIONS

IBM Resolution Indicator for Scanning Electron Microscopes, Thomas J. Watson Research Center, Yorktown Heights, N.Y., Aug., 1972.
National Bureau of Standards Special Publication 400-17, "Semiconductor Measurement Technology Progress Report," Oct. 1-Dec. 31, 1974, (Nov. 1975), pp. 36, 37.
Metal Research Institute TNO, J. W. Schinkel, Dept. for Applied Chemistry, Netherland.

*Primary Examiner*—C. W. Lanham
*Assistant Examiner*—Daniel C. Crane
*Attorney, Agent, or Firm*—Eugene J. Pawlikowski; Alvin J. Englert

[57] ABSTRACT

A microscopic length scale typically about 50 μm long and graduated in several intervals ranging from 1 μm to 20 μm. The scale is useful in calibrating the magnification of scanning electron microscopes (SEMs) and other electron imaging instruments. The scale comprises alternating layers of two metals deposited on a substrate. The two metals have substantially different electron emission coefficients to provide contrasting emission signals when scanned by an electron beam. One of the metals, preferably gold, is deposited in uniform layers about 40-80 nm thick. The other metal, preferably nickel, is deposited in several layers ranging from 1 μm or so thick near the substrate to 20 μm thick in the outermost layer. The resultant multilayer composite is cut into one or more samples and each sample is mounted on edge. The exposed edge is ground and metallographically polished and a microscopic indentation is made in the substrate near the first gold layer. The indentation defines a reference region, and the distances between the first gold layer and the subsequent gold layers in the reference region are measured. The measurement is made using a similar sample which was previously calibrated with the aid of a polarizing layer interferometer.

7 Claims, 4 Drawing Figures

METHOD FOR FABRICATING A SCANNING ELECTRON MICROSCOPE MICROMETER SCALE

This is a division of application Ser. No. 736,978 filed Oct. 29, 1976, now U.S. Pat. No. 4,068,381.

BACKGROUND OF THE INVENTION

This invention relates to a microscopic length scale for calibrating the magnification of electron beam instruments such as SEMs, electron and ion microprobes and electron beam writing devices.

The magnification of an SEM, for example, is calibrated by placing an artifact of known dimensions in the instrument and measuring the magnified dimension of the artifact. If the artifact is known to be 10 $\mu$m, for instance, and its video image measures 9.9 mm, the magnification is 9900/10 = 990$\times$. In this example, the nominal magnification of the SEM would probably read 1000$\times$ and the information would be used to construct a calibration curve, or the SEM's magnification controls would be trimmed to produce a video image precisely 1000 $\times$ 10 $\mu$m = 10 mm long.

Prior artifacts include gold-coated latex spheres and gold-coated carbon replicas of cross-ruled spectrographic gratings. The diameters of the latex spheres are difficult to measure and tend to change when the spheres are heated by the SEM electron beam. Thus the sphere diameters during a calibration are highly uncertain. The dimensions of the spectrographic gratings tend to change during each successive replication and it is difficult to clean the gratings of the contamination due to the electron beam striking any vacuum oil film thereon.

It has been proposed to use alternating layers of two semiconductor materials such as gallium arsenide and gallium arsenide phosphide as a resolution indicator. However, these materials are not stable when placed in an SEM and hence cannot provide a useful length scale.

SUMMARY OF THE INVENTION

The present invention obviates all of the problems associated with the prior artifacts. In a preferred embodiment, the invention comprises gold and nickel layers alternately plated on a Monel substrate. The gold layers are about 40-80 nm thick and the nickel layers are 1, 1, 3, 5, 20 and 20 $\mu$m thick. This provides a scale with graduations at 1, 2, 5, 10, 30, and 50 $\mu$m making it easy to measure dimensions of 1-50 $\mu$m. A sample of the multilayer composite is mounted on edge and metallographically finished for use in an SEM. The scale is of known accuracy, is dimensionally stable, and is easily repolished to remove contamination.

DESCRIPTION OF THE PREFERRED EMBODIMENTS

Figure 1:
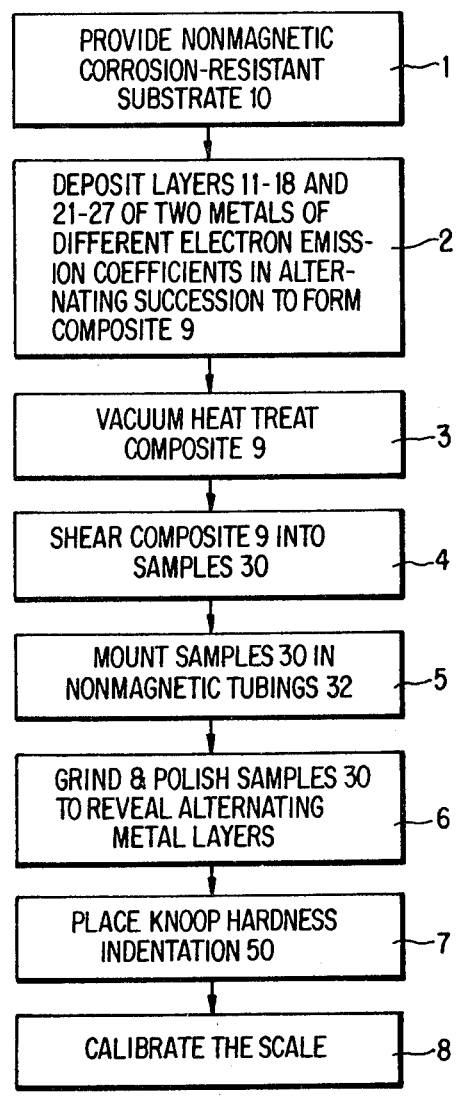
FIG. 1 is a block diagram of the steps involved in manufacturing a microscopic scale according to the present invention.

As shown in FIG. 1, step 1 of the invention is the provision of a substrate 10 which is substantially nonmagnetic in order to avoid perturbing an SEM beam. The substrate 10 must be corrosion resistant, durable, and capable of receiving one of two metals which will subsequently be deposited on it. The two metals will be struck by the SEM beam and must give contrasting emission signals. The two metals therefore must have substantially different electron emission coefficients. The two metals also must be substantially nonmagnetic (or negligibly magnetic) and must be corrosion resistant and durable in order to provide a dimensionally stable scale. The resultant multilayer composite will be cut into small samples, preferably by shearing, so the substrate 10 should be easily sheared. The substrate 10 preferably should be readily available in flat, "mirror bright" sheet form. In view of these considerations, the preferred substrate 10 is a nickel-copper alloy such as Monel about 0.5-1 mm thick and the two metals to be deposited thereon are nickel and gold.

Step 2 of the invention consists of the deposition of the two metals in alternating succession on the substrate 10. The preferred method of deposition is electroplating and hence the substrate 10 is a convenient size such as about 100-300 mm on a side, giving an area of about 0.01-0.1 m$^2$. The mirror bright sheet is cleaned in the conventional manner prior to the electroplating and a base layer of Wood's strike nickel about 1 $\mu$m thick is plated on one side, using about 10 Ah/m$^2$. This preferably is followed by an additional base layer of bright nickel about 10-30 $\mu$m thick, using a conventional bright bath and a current of about 300 Ah/m$^2$.

The bright nickel-coated substrate 10 if then cleaned but not etched and placed in a conventional gold plating bath. The gold plating should be at least about 40 nm thick, so that its cross section will be visible in a moderately powerful SEM. For example, at 1000$\times$, the 40 nm or 0.04 $\mu$m cross section will appear 0.04 mm wide. The gold plating preferably is not more than about 80 nm thick, so that its cross section at high magnifications (10,000$\times$ and up) will not be unduly wide. This 40-80 nm gold layer is usually plated with a current of about 1 Ah/m$^2$. The precise value can be determined by using a range of values in experiments before attempting to construct a finished scale.

Figure 2:
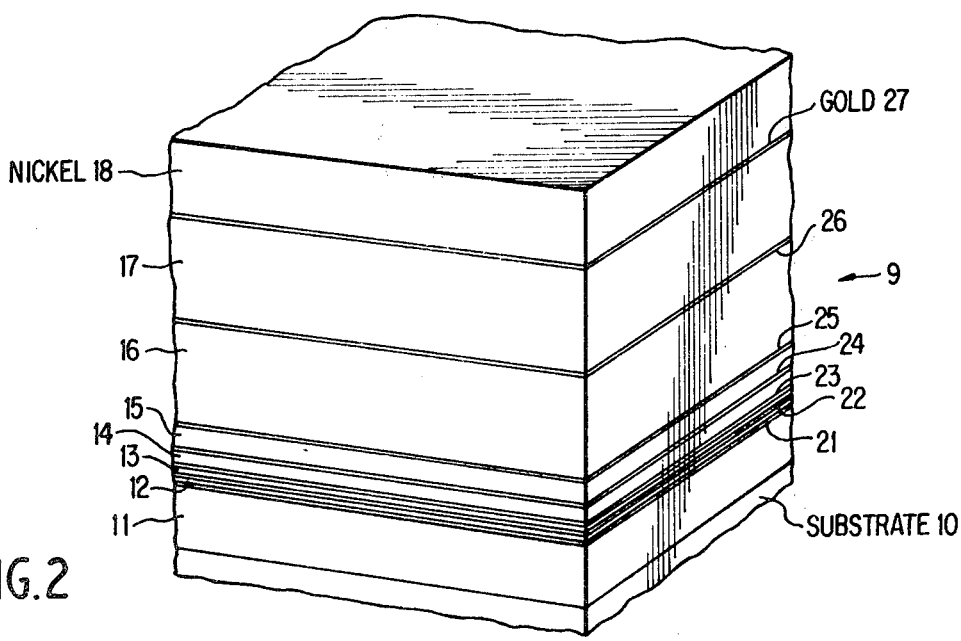
FIG. 2 is a greatly enlarged fragmentary perspective view of the multilayer composite of this invention.

FIG. 2 shows the multilayer composite 9 including the Monel substrate 10, the Wood's strike and bright nickel base layer 11, and the first gold layer 21. After the gold layer 21 is deposited, the composite is again cleaned and placed in the bright nickel bath. Now the total current is carefully measured in order to deposit a nickel layer 12 very nearly equal to the desired minimum scale interval, usually 0.5 $\mu$m or 1 $\mu$m. Generally, a 1 $\mu$m layer requires about 14 Ah/m$^2$.

Figure 4:
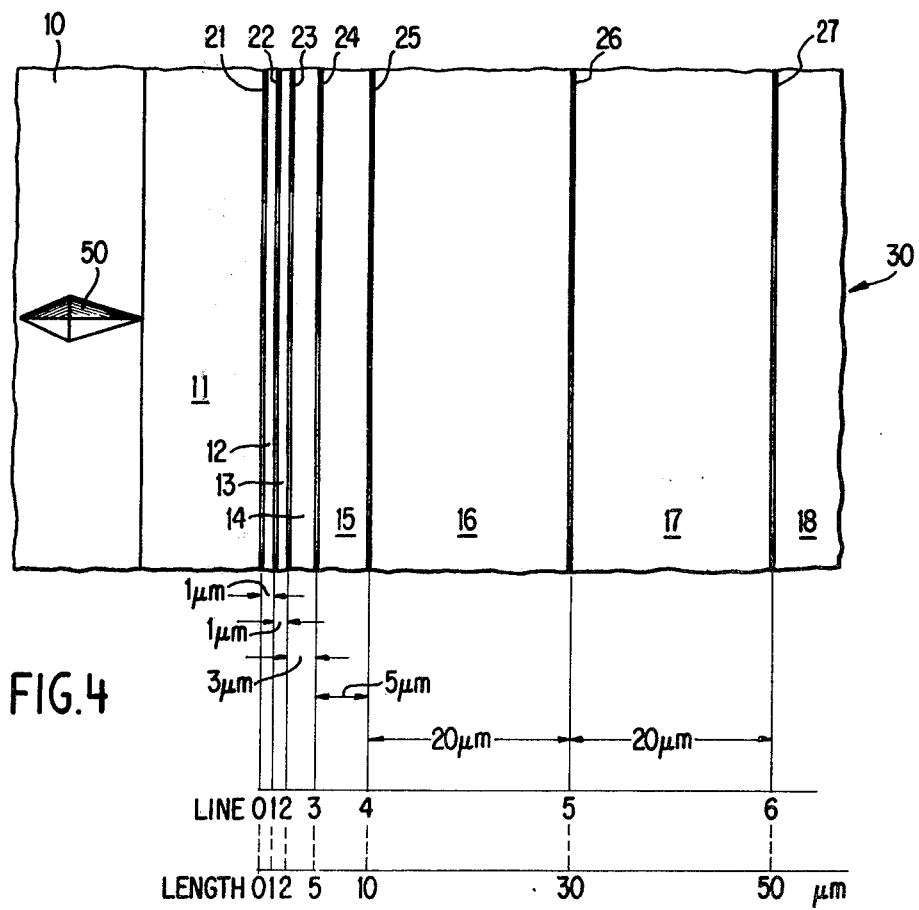
FIG. 4 is a greatly enlarged view of the central portion of the scale of FIG. 3.

The first gold layer 21 forms the zero line on the scale and the subsequent nickel layer 12 forms the first scale interval, as shown in FIG. 4. The nickel layer 12 therefore is followed by the gold layer 22 which serves as the 1 line on the scale. This gold layer 22 (and each subsequent gold layer 23-27) is about 40-80 nm thick. The next nickel layer 13 preferably is also 1 $\mu$m thick, followed by nickel layers of 3, 5, 20 and 20 $\mu$m, as shown in FIG. 4. The scale thus is graduated at 1, 2, 5, 10, 30 and 50 $\mu$m. This arrangement enables one to measure any length from 1-50 $\mu$m and also minimizes the number of layers which must be deposited. To protect the last gold layer 27 from damage during the operations to follow, a final nickel layer 18 of about 10–20 μm is deposited, thereby completing the multilayer composite 9. In FIGS. 2 and 4, it should be noted that the thickness of all the deposited layers is less than 100 μm, which is much less than the thickness of the substrate 10 (1 mm or 1000 μm). The multilayer gold-nickel structure is a thin "coating" on the substrate.

In step 3 of the invention the composite 9 is vacuum heat treated to allow trapped gases to escape and to relieve stresses in the various layers. This treatment prevents the gold and nickel layers from separating from each other or from the substrate during the subsequent shearing, grinding and polishing steps. Incidentally, the heat treatment also produces a small amount of interdiffusion of the gold and nickel layers. The composite is placed in an oven which is evacuated to about $10^{-3}$–$10^{-5}$ Torr, heated to about 250°–300° C for a period of about 15–20 h and cooled to room temperature over a period of about 1–2 h.

In step 4 the heat treated composite is cut (diced) into one or more small samples. The plating near the edges of the composite sheet generally is of poor uniformity, so the outer 10–30 mm is immediately trimmed away, preferably using a bed-type metal shear. Shearing is preferred to sawing, burning or the like because it is quick, it provides a relatively smooth cut surface and it does not result in lost material. The remaining composite is then sheared into strips each of which is sheared into the samples, preferably about 5–10 mm square.

Figure 3:
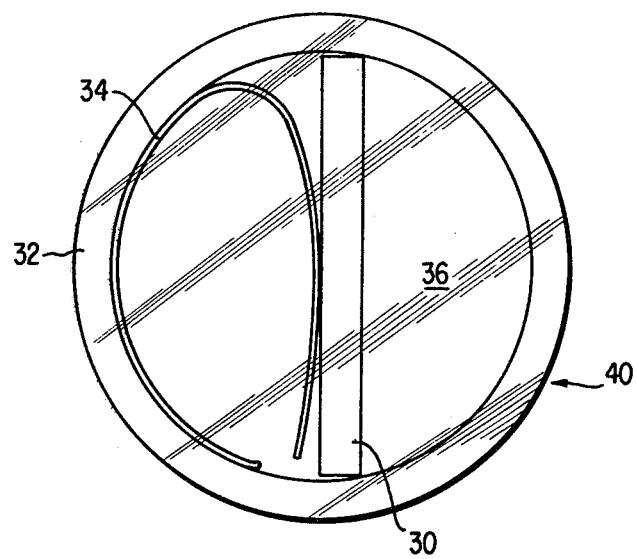
FIG. 3 is an enlarged plan view of a finished scale fabricated in accordance with the invention.

Step 5 concerns the mounting of each of the squares on edge to provide, when observed in the SEM, an edge view of the various gold and nickel layers. As shown in FIG. 3, a sample 30 is inserted into a small section of nonmagnetic, corrosion resistant tubing 32 the inner diameter of which is slightly greater than the width of the sample 30. The sample 30 is then held in axial alignment in the tubing 32 by a flat spring 34 bent into a C shape. In a preferred example, the sample 30 is about 9 mm × 9 mm and the tubing 32 is about 9 mm long with an inner diameter of about 9.5 mm. The tubing 32 preferably is 304 stainless steel and the spring 34 is precipitation hardenable stainless steel flat spring stock. A small circumferential V groove (not shown) is internally machined in the tubing 32 at its midlength to mechanically secure a metal-filled metallographic mounting resin 36. The metal filling of the resin provides the necessary electrical connection between the electron beam which will scan the scale 40 and the SEM stub on which the scale will be mounted. The preferred resin 36 comprises copper-filled diallyl phthalate. The tubing 32 is encapsulated in the powdered resin and heated in a steel mold under high pressure until the resin thermosets.

In step 6, the circular ends of the filled tubing 32 are ground perpendicular to the tubing axis and are metallographically polished in the conventional manner using increasingly finer abrasives. The polished ends are then examined in an optical microscope to detect any separation of the gold and nickel layers from each other or from the substrate and to detect any cracks or voids in the sample. If the sample is free of defects, step 7 is performed in which a microscopic reference mark 50, shown in FIG. 4, is placed in the substrate 10 of the scale near the first gold line 21 to define a reference region. FIG. 4 is a greatly enlarged view of the central portion of the polished edge of sample 30 of FIG. 3. The mark 50 preferably is made under an optical microscope using a conventional Knoop hardness testing machine and about a 50–100 g load.

In step 8, the distances between the gold layers 21–27 in the reference region opposite the reference mark 50 are measured (calibrated) using an SEM. To do this, a "master" scale is prepared by selecting an acceptable scale 40, FIG. 3, and subjecting it to a conventional sputter etching treatment in which the surface portions of the gold layers 21–27 are preferentially removed by bombardment by argon ions. As a result, microscopically shallow grooves (not shown) are formed between the nickel layers 11–18. In an optical instrument, the grooves absorb light and therefore appear as black graduation lines against the bright nickel background. The distances between the grooves are then measured using a highly accurate polarizing laser interferometer. The measurements preferably are made and certified by a well equipped standards laboratory. The optically calibrated master is then examined in the SEM and the contrasting emitted electron images of the gold and nickel layers are photographed. The distances between the photographed images of the gold lines will equal the optically calibrated distances, assuming that the nickel and gold layers are substantially uniformly thick so that the sputter etching does not appreciably disturb the interlayer distances. After the calibrated master scale is photographed, one (or more) other scales 40 also placed in the instrument are photographed. Using the photograph of the master scale as a standard, the photographs of the other scales are then calibrated to yield the precise distances from the zero line, FIG. 4, of the nominally 1, 2, 5, 10, 30 and 50 μm markings. Preferably, each scale 40 is measured three times and the resultant three measurements of each distance interval are averaged to provide a mean figure.

In addition to providing a calibrated length scale, the present invention also provides a series of straight and parallel gold lines (due to the 5–10 mm edge dimension of the square) which can be used as a reference to detect various field-of-view distortions in an SEM. Photographing the scale at various angular orientations, for example, will often reveal distortions near the edges of the instrument's CRT. If desired, a scale calibrated against the master as described can also be sputter etched as previously summarized, to provide an optical microscope scale of very high accuracy and precision.

Obviously, numerous modifications and variations of the present invention are possible in light of the above teachings. It is therefore to be understood that within the scope of the appended claims, the invention may be practiced otherwise than as specifically described herein.

We claim:

1. A method of fabricating a scanning electron microscope micrometer scale comprising:
    providing a durable, corrosion resistant substantially nonmagnetic substrate;
    electroplating a plurality of layers of two substantially nonmagnetic, corrosion resistant metals of substantially different electron emission coefficients in alternating succession on said substrate to form a composite;
    the layers of one of said two metals having a uniform thickness of about 40–80 nm;
    the layers of the other of said two metals having thicknesses ranging from about 1 μm near said substrate to many μm away from said substrate;

heating said composite to about 250°–300° C at about $10^{-3} - 10^{-5}$ Torr for about 15–20 h;

shearing said vacuum heat-treated composite into small samples;

mounting said samples on edge in sections of substantially non-magnetic, corrosion resistant tubing;

grinding and metallographically polishing said mounted samples;

placing a microscopic indentation in the substrate of each sample adjacent said deposited layers to define a reference region; and measuring the distances between said layers of said one of said two mtals in said reference region.

2. The method set forth in claim 1, wherein said one of said two metals is gold.

3. The method set forth in claim 1, wherein said other of said two metals is nickel.

4. The method set forth in claim 1, wherein said substrate is a nickel-copper alloy.

5. The method set forth in claim 4, wherein said alloy is Monel.

6. The method set forth in claim 1, wherein said samples are mounted in said tubing sections with copper-filled diallyl phthalate.

7. The method set forth in claim 1, wherein said small samples are about 5–10 mm square.

* * * * *